United States Patent
Okada

(10) Patent No.: US 10,078,275 B2
(45) Date of Patent: Sep. 18, 2018

(54) MEASUREMENT APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Yoshiyuki Okada, Sakura (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1122 days.

(21) Appl. No.: 13/954,031

(22) Filed: Jul. 30, 2013

(65) Prior Publication Data

US 2014/0036251 A1 Feb. 6, 2014

(30) Foreign Application Priority Data

Aug. 3, 2012 (JP) ................................ 2012-172517

(51) Int. Cl.
| | |
|---|---|
| *G02B 27/52* | (2006.01) |
| *G03F 7/20* | (2006.01) |
| *G01B 7/00* | (2006.01) |
| *G01B 21/04* | (2006.01) |
| *G01B 11/02* | (2006.01) |

(52) U.S. Cl.
CPC ......... *G03F 7/70775* (2013.01); *G01B 7/003* (2013.01); *G01B 11/026* (2013.01); *G01B 21/045* (2013.01); *G03F 7/70725* (2013.01)

(58) Field of Classification Search
CPC .................. G03F 7/70775; G03F 7/70225
USPC ............................................. 355/52, 53, 55
See application file for complete search history.

(56) References Cited

U.S. PATENT DOCUMENTS

| | | | |
|---|---|---|---|
| 4,700,129 A | 10/1987 | Yoshizawa et al. | |
| 7,106,444 B2 | 9/2006 | Nakajima | |
| 7,619,738 B2 | 11/2009 | Van Haren et al. | |
| 7,933,373 B2 | 4/2011 | Kishibe et al. | |
| 2004/0233080 A1 | 11/2004 | Takehara | |
| 2008/0094592 A1* | 4/2008 | Shibazaki | G03F 7/70725 355/53 |
| 2009/0027640 A1 | 1/2009 | Shibazaki et al. | |
| 2011/0141451 A1 | 6/2011 | Yamaguchi et al. | |
| 2014/0036250 A1 | 2/2014 | Okada | |
| 2014/0049758 A1 | 2/2014 | Shibazaki | |

FOREIGN PATENT DOCUMENTS

| | | |
|---|---|---|
| JP | 3011555 B2 | 2/2000 |
| JP | 2002-228488 A | 8/2002 |
| JP | 2005003672 A | 1/2005 |

(Continued)

OTHER PUBLICATIONS

Notice of Allowance issued in TW102126458, dated Jul. 31, 2015.

(Continued)

*Primary Examiner* — Hung Henry Nguyen
(74) *Attorney, Agent, or Firm* — Rossi, Kimms & McDowell LLP

(57) ABSTRACT

A measurement apparatus is configured to measure a position of an object based on a first phase signal and a second phase signal whose phases are different from each other and includes a compensator configured to compensate for a fluctuation in a phase difference between the first phase signal and the second phase signal based on a frequency of at least one of the first phase signal and the second phase signal.

13 Claims, 9 Drawing Sheets

(56) References Cited

FOREIGN PATENT DOCUMENTS

| | | | |
|---|---|---|---|
| JP | 2007107886 | A | 4/2007 |
| JP | 2012147026 | A | 8/2012 |
| KR | 1020020006690 | A | 1/2002 |
| KR | 100552455 | B1 | 2/2006 |
| KR | 1020080012823 | A | 2/2008 |
| KR | 101031770 | B1 | 4/2011 |

OTHER PUBLICATIONS

Office Action issued in U.S. Appl. No. 13/953,901 dated Aug. 5, 2016.
John Gasking, Resolver-to-Digital Conversion—A Simple and Cost Effective Alternative to Optical Shaft Encoders. Analog Devices, Jul. 16, 2002, pp. 1-8.
U.S. Appl. No. 13/953,901, filed Jul. 30, 2013.
Notice of Allowance issued in TW102126459, dated Aug. 24, 2015.
Office Action issued in KR10-2013-0086715, dated Aug. 31, 2015. English translation provided.
Office Action issued in KR10-2013-0086717, dated Aug. 31, 2015. English translation provided.
Office Action issued in U.S. Appl. No. 13/953,901 dated Nov. 27, 2017.
Office Action issued in U.S. Appl. No. 13/953,901 dated Mar. 20, 2017.
Office Action issued in U.S. Appl. No. 13/953,901 dated Apr. 17, 2018.

\* cited by examiner

MEASUREMENT APPARATUS, LITHOGRAPHY APPARATUS, AND METHOD OF MANUFACTURING ARTICLE

BACKGROUND OF THE INVENTION

Field of the Invention

The present disclosure relates to a measurement apparatus, a lithography apparatus, and a method of manufacturing an article.

Description of the Related Art

In recent years, a lithography device that is used in the manufacture of a device such as a semiconductor integrated circuit requires high productivity (throughput) and a capacity to form an extremely minute pattern (resolution). A stage that mounts an original plate or substrate in the lithography device must be positioned with both high velocity and high accuracy. Consequently, a measurement device is required that enables the accurate measurement of a position of the high-velocity operation stage. The positioning accuracy depends on the accuracy of the measurement of the stage position. For example, an encoder is used as a device for measuring with sub-nanometer accuracy the position of the high-velocity operation stage. For example, the output signal from the encoder is configured by a sine-wave signal that includes two phases, an A phase and a B phase, in which the phases are mutually shifted by 90 degrees. The offset and the amplitude of the respective phase signals or the phase difference between the phases must be correctly adjusted. Japanese Patent Application Laid-Open No. 2002-228488 discloses an adjustment method for the amplitude, offset and phase difference of this type of output signal.

When an encoder is used for the measurement of a position of the high-velocity operation stage, the frequency of the output signal from the encoder is proportional to the moving velocity of the stage. When the moving velocity of the stage is increased to improve productivity, the frequency of the encoder output signal also undergoes a proportional increase. Conversely, the encoder output signal is limited to the frequency band of the detection circuit used for signal output, and therefore, a phase delay occurs at a high frequency. Furthermore, the band (the frequency characteristics) of the respective detection circuits for the A phase and the B phase may be mutually different as a result of the deviation in the performance of the components in the detection circuit. As a result, when the frequency is high, the characteristics of the phase delay differ, and the phase difference between the phases deviates from 90 degrees. Note, a shift of the phase difference between the phases also occurs as a result of the difference in the signal propagation delay time in the pattern length of the substrate or the cable length, or the digital circuit or the A/D converter related to the respective phase signals. The shift in the phase difference causes an error in positional measurement and consequently reduces positioning accuracy.

SUMMARY OF THE INVENTION

The present invention provides, for example, a measurement apparatus advantageous in compensating for a fluctuation in a phase difference between multiphase signals.

An aspect of the present disclosure is a measurement apparatus is configured to measure a position of an object based on a first phase signal and a second phase signal whose phases are different from each other and includes a compensator configured to compensate for a fluctuation in a phase difference between the first phase signal and the second phase signal based on a frequency of at least one of the first phase signal and the second phase signal.

Further features of the present invention will become apparent from the following description of exemplary embodiments with reference to the attached drawings.

DESCRIPTION OF THE EMBODIMENTS

The embodiments for executing the present disclosure will be described below making reference to the figures.

Figure 1:
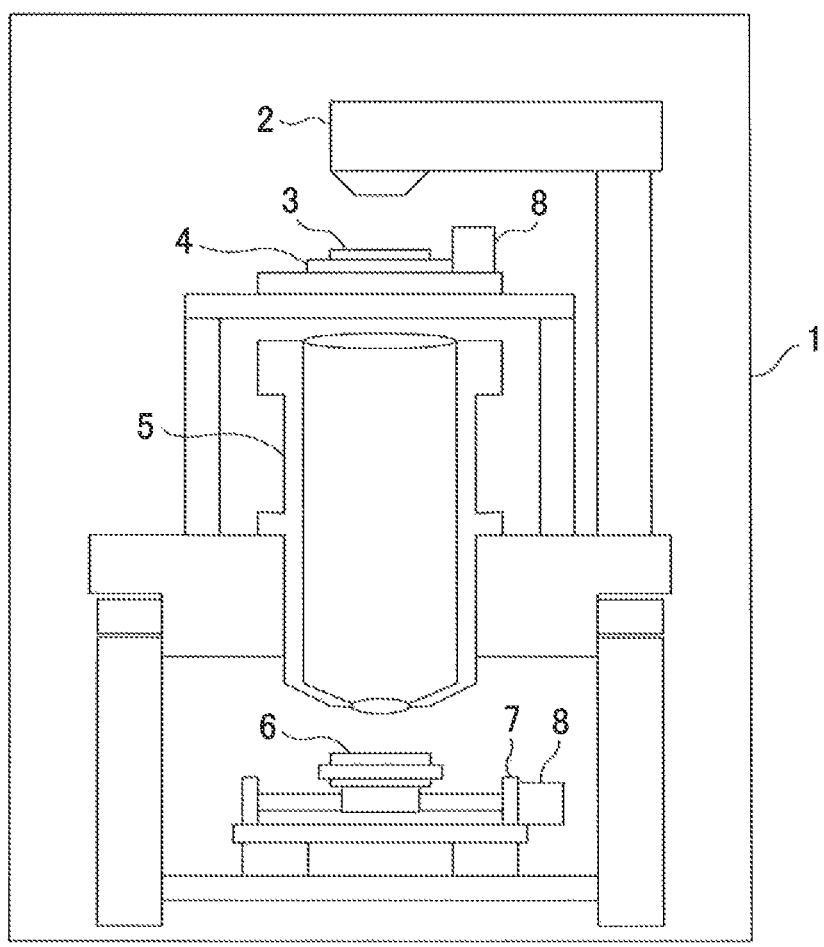
FIG. 1 illustrates a configuration of an exposure device according to a first exemplary embodiment of the present disclosure.

Firstly, an exposure device will be described as an example of a lithography device applying the present invention. FIG. 1 is a schematic illustration of the configuration of an exposure device 1. The exposure device 1 according to the present exemplary embodiment is a projection-type exposure device configured to expose a pattern, formed on a mask (original plate) by a step and scan method or a step and repeat method, onto a glass plate (substrate), that is the processed substrate. The exposure device 1 basically includes an illumination optical system 2, a reticle stage 4 configured to hold a reticle 3, a projection optical system 5, a wafer stage 7 configured to hold a wafer 6, and a measurement device (measurement head) 8.

The illumination optical system 2 includes a laser oscillator (not illustrated) that is a light source, and is a device configured to illuminate the reticle 3 described below that forms the circuit pattern to be transferred. Here, the laser that can be used as a light source is an ArF excimer laser having a wavelength of approximately 193 nm, a KrF excimer laser having a wavelength of approximately 248 nm, a F2 excimer laser having a wavelength of approximately 157 nm, or the like. The type of laser is not limited to an excimer laser, and for example a YAG laser may be used. Furthermore, there is no limitation to the number of lasers. When a laser is used as the light source, it is preferred to use a light flux shaping optical system configured to shape a parallel light flux from a laser oscillator into a desired beam configuration, or an incoherent optical system that makes an incoherent configuration of a coherent laser. Furthermore, the light source that can be used in the light source unit is not limited to a laser, and may employ a lamp such as one or a plurality of mercury lamps, or xenon lamps, or an extreme ultraviolet light source.

The reticle 3 is an original plate of quartz glass, and forms a circuit pattern to be transferred. Furthermore, the reticle stage (original plate holder) 4 is supported movable in the XY direction on the reticle stage guide (not shown), and is a stage device that holds the reticle 3 by suction through a reticle chuck (not illustrated).

The projection optical system 5 projects and exposes the pattern on the reticle 3, that is illuminated by exposure light from the illumination optical system 2, with a predetermined magnification (for example, ¼ or ⅕) onto the wafer 6. An optical system configured only from a plurality of optical elements or an optical system (catadioptric optical system) configured from at least one concave mirror and a plurality of optical elements can be adopted as the projection optical system 5. Alternatively, an optical system configured from diffractive optical elements such as at least one kinoform and a plurality of optical elements, an all mirror optical system, or the like can also be adopted as the projection optical system 5. The reticle stage guide (not illustrated) and the projection optical system 5 are supported on a lens barrel support member (not illustrated) that is mounted on the floor surface (base surface).

The wafer 6 is a substrate to be processed that is formed from monocrystalline silicon and in which the surface is coated with a resist (photosensitive agent). The wafer stage (substrate holder) 7 is a stage device that can be driven in a three dimensional direction, and includes a fine-driven stage and a coarse-driven stage (not illustrated). The fine-driven stage is a stage that is configured for fine driving in the respective directions of x, y, z, ωx, ωy, ωz, and holds the wafer 6 by suction through a wafer chuck (not illustrated). The coarse-driven stage is a stage that is configured for driving in the respective directions of x, y, ωz with holding the fine-driven stage, and is installed on the stage support member that is mounted on the floor surface.

The measurement device 8 is, for example, a measurement head of an encoder, and is preferably mounted on the stage (reticle stage 4 or wafer stage 7) that moves together with the reticle 3 or the wafer 6. The encoder includes a scale, on which elements are disposed at an interval for generating a signal that is required for measuring of the position of the object to be measured, read by the measurement head (not illustrated), and is mounted on an immoveable member (support member, or the like) configured to be opposed to the measurement head. In FIG. 1, only the example of the measurement head is disclosed as the measurement device 8. In the present embodiment, the measurement head is mounted on the stage, and the scale is mounted on the support member, however, the measurement head may be mounted on the support member and the scale may be mounted on the stage. The position measurement device includes general application of an interferometer. An interferometer measures a position by detection of interfering light from the reflected light obtained by illuminating laser light onto a mirror. However, the encoder detects the interfering light in diffractive light obtained by illuminating light onto the lattice pattern of the scale to thereby measure a position. Normally, fluctuation in the humidity, temperature or pressure in the optical paths between the illumination unit and detection unit of the respective measurement devices and the mirror or the lattice pattern causes a change in the refractive index, and therefore causes an error in the final position measurement. Therefore, since the dimension of the error is reduced as the optical path length is reduced, an encoder that is configured to enable the light illumination unit and the light detection unit to be disposed in proximity to the mirror or the lattice pattern, and thereby enable more highly accurate positional measurement than an interferometer.

The exposure device 1 includes an alignment detection system configured to execute position determination of the wafer 6, a conveyance system configured to carry-in/carry-out the reticle 3 or the wafer 6 in the exposure device 1, and a control device (not illustrated). The alignment detection system includes an alignment scope and a focus sensor (not illustrated). The alignment scope is a measurement device configured to execute measurement of the positional deviation in the x and y directions of the wafer 6, or the like. The focus sensor is a measurement device configured to execute measurement of the positional deviation in the z direction of the wafer 6, or the like. In the same manner as described above, although not illustrated, the exposure device 1 includes a reticle alignment detection system for execution of the positional determination of the reticle 3.

The conveyance system includes a reticle conveyance system configured to carry-in/carry-out the reticle 3, and a wafer conveyance system configured to carry-in/carry-out the wafer 6. The reticle conveyance system includes a first conveyance robot and a second conveyance robot, and is configured to execute conveyance between a reticle Pod that is mounted on the predetermined reticle carry-in entrance, and the reticle stage 4. The reticle Pod is a carrier configured to hold a plurality of reticles 3 in an inner portion. The wafer conveyance system includes a third conveyance robot and a fourth conveyance robot, and is configured to execute conveyance between a wafer carrier that is mounted on the predetermined wafer carry-in entrance, and the substrate stage. The wafer carrier is a carrier configured to hold a plurality of wafers 6 in an inner portion, such as a FOUP (front opening unified pod) that is a container provided with a front door.

The control device is a control device configured to operate the respective constituent elements of the exposure device 1, and to control adjustment processes, or the like. Although not illustrated, the control device is configured by a computer, a sequencer, or the like that is connected by a circuit to the respective constituent elements of the exposure device 1 and includes a storage device such as a magnetic storage medium or the like, and executes control of the respective constituent elements by application of a program or a sequence.

Next, the exposure processing executed by the exposure device 1 will be described. Firstly, the wafer conveyance system conveys the wafer 6 that is to be processed from the wafer carrier to the wafer chuck. The reticle conveyance system conveys the reticle 3 for use in the lot from the reticle Pod to the reticle stage 4. Then the reticle 3 is positioned by the reticle alignment detection system, and is moved by driving the reticle stage 4 to a predetermined position on the projection optical system 5. In the same manner, the wafer 6 is positioned by the alignment detection system, and then is disposed by driving the substrate stage at a predetermined position directly under the projection optical system 5. Thereafter, the illumination optical system 2 illuminates illumination light onto the reticle 3. At the same time, the exposure device 1 executes synchronous driving of the reticle stage 4 and the wafer stage 7 at the velocity determined by the magnification ratio of the projection optical system 5 so that the circuit pattern formed on the reticle 3 is transferred onto a predetermined position of the wafer 6. The most recent measurement results of the alignment detection system are used in relation to the predetermined substrate stage driving reference value so that the exposure device 1 executes high accuracy transfer of the circuit pattern. Thereafter, the exposure device 1 executes sequential driving of the wafer stage 7 and the reticle stage 4 and repeats the exposure process to thereby transfer the circuit pattern across the entire surface of the wafer 6. To further enhance productivity, it is required that the respective stages of the reticle stage 4 and the wafer stage 7 are driven at an extremely high velocity, and the velocity or position is controlled with extremely high accuracy to thereby enable miniaturization of exposure light.

Figure 2:
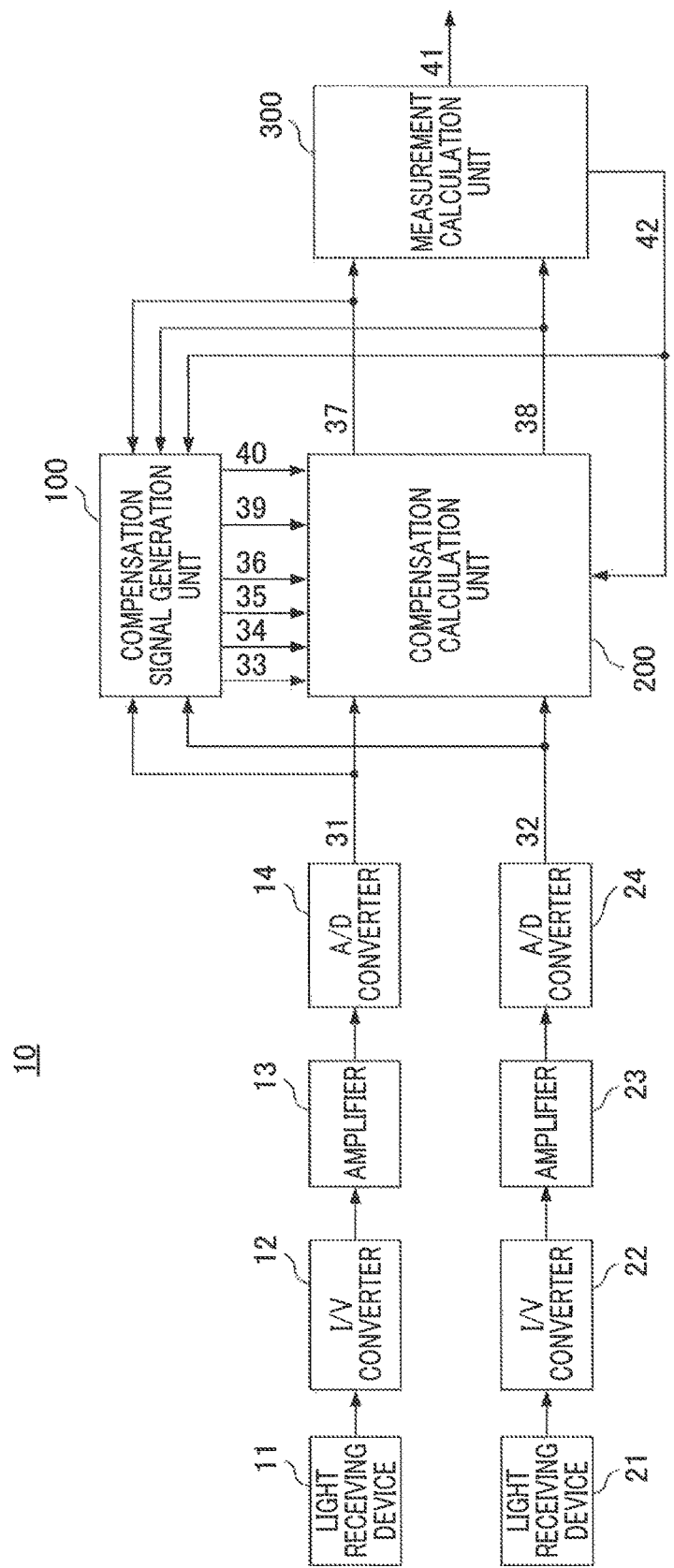
FIG. 2 illustrates a configuration of a calculation unit according to the first exemplary embodiment of the present disclosure.

The encoder will be described below as an example of the measurement device according to the first embodiment of the present invention. The phases of the encoder are configured by two phases with a 90 degree difference or by three phases with a 120 degree difference, in which the detection light is configured as a sine wave signal in response to the change in position. Since there is no difference in the basic operation of the two phases and three phases, in the present embodiment, a two-phase encoder will be used as an example. The encoder having the configuration as illustrated in FIG. 2 includes a calculation unit configured to calculate a position using two-phase detection light (signal) detected by a detection unit. As illustrated in FIG. 2, the calculation unit 10 includes light receiving devices 11 and 21, I/V converters 12 and 22, and amplifiers 13 and 23, and A/D converters 14 and 24, a compensation signal generation unit 100, a compensation calculation unit (compensator) 200, and a measurement calculation unit 300.

The light receiving devices 11 and 21 convert two phase signals, that is detected by the detection unit of the encoder, into currents. When the two phase signals that exhibit mutually different positions in the encoder are respectively denoted as an A phase (first phase signal) and a B phase (second phase signal), the light receiving device 11 converts the A phase signal, and the light receiving device 21 converts the B phase signal, respectively to a current. The light receiving devices 11 and 21 may also be configured using a PIN photodiode, an avalanche photodiode or the like. Next, the I/V converters 12 and 22 are configured using a resistor and a calculation amplifier (OP amp), and respectively converts the two phase signals, that are converted to a current by the light receiving devices 11 and 12, to a voltage. The I/V converter 12 converts the current from the light receiving device 11, and the I/V converter 22 converts the current from the light receiving device 21, respectively to a voltage. Next, the amplifiers 13 and 23 amplify the voltage that is converted by the I/V converters 12 and 22 to a predetermined voltage. The amplifier 13 amplifies the voltage from the I/V converter 12, and the amplifier 23 amplifies the voltage from the I/V converter 22. Next, the A/D converter 14 and 24 convert the analog signal amplified to a predetermined voltage in the amplifiers 13 and 23 to a digital signal. The A/D converter 14 converts the signal from the amplifier 13, and the A/D converter 24 converts the signal from the amplifier 23, respectively to a digital signal.

Figure 3:
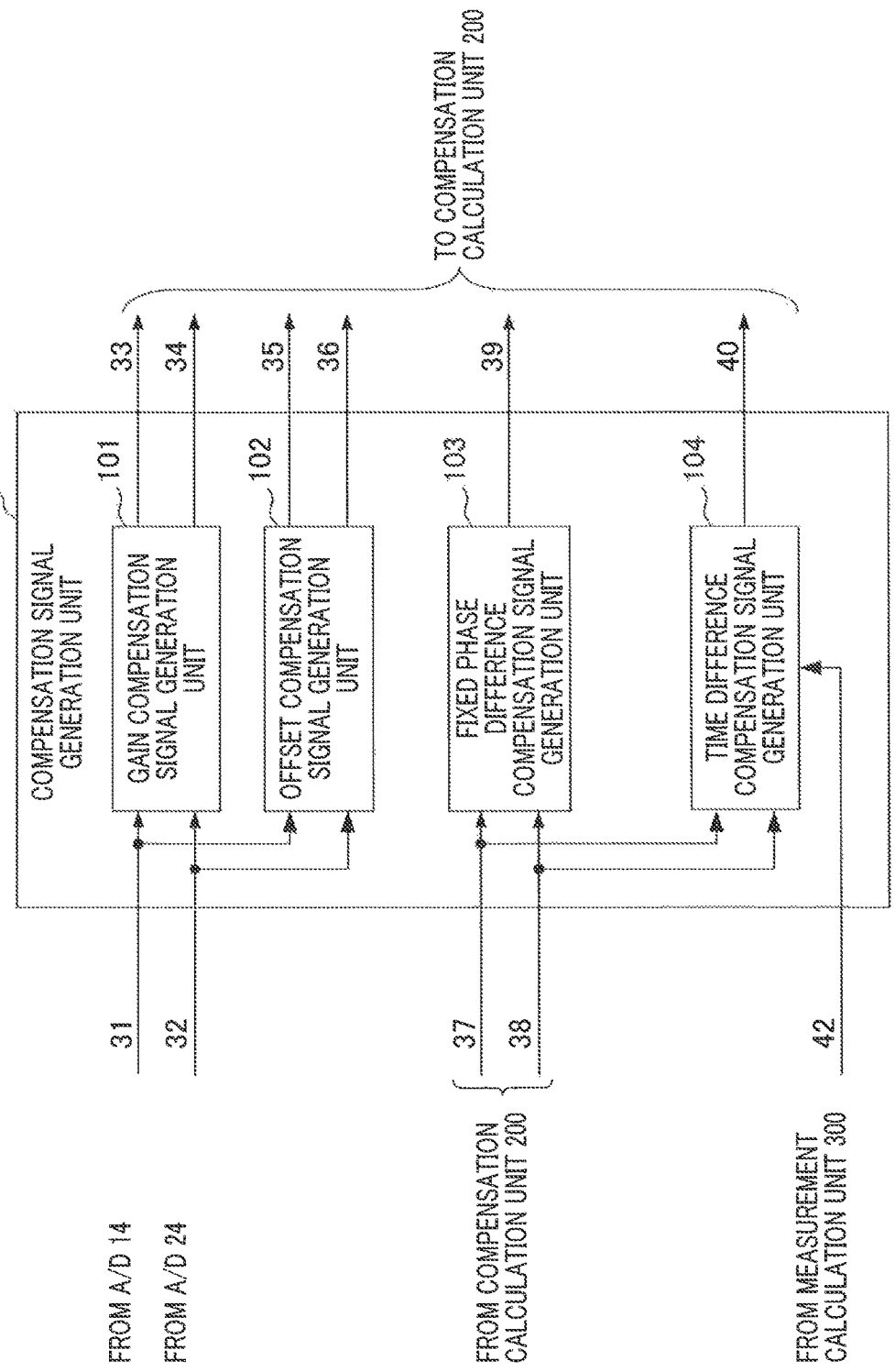
FIG. 3 illustrates a configuration of a compensation signal generating unit according to the first exemplary embodiment of the present disclosure.
Figure 4:
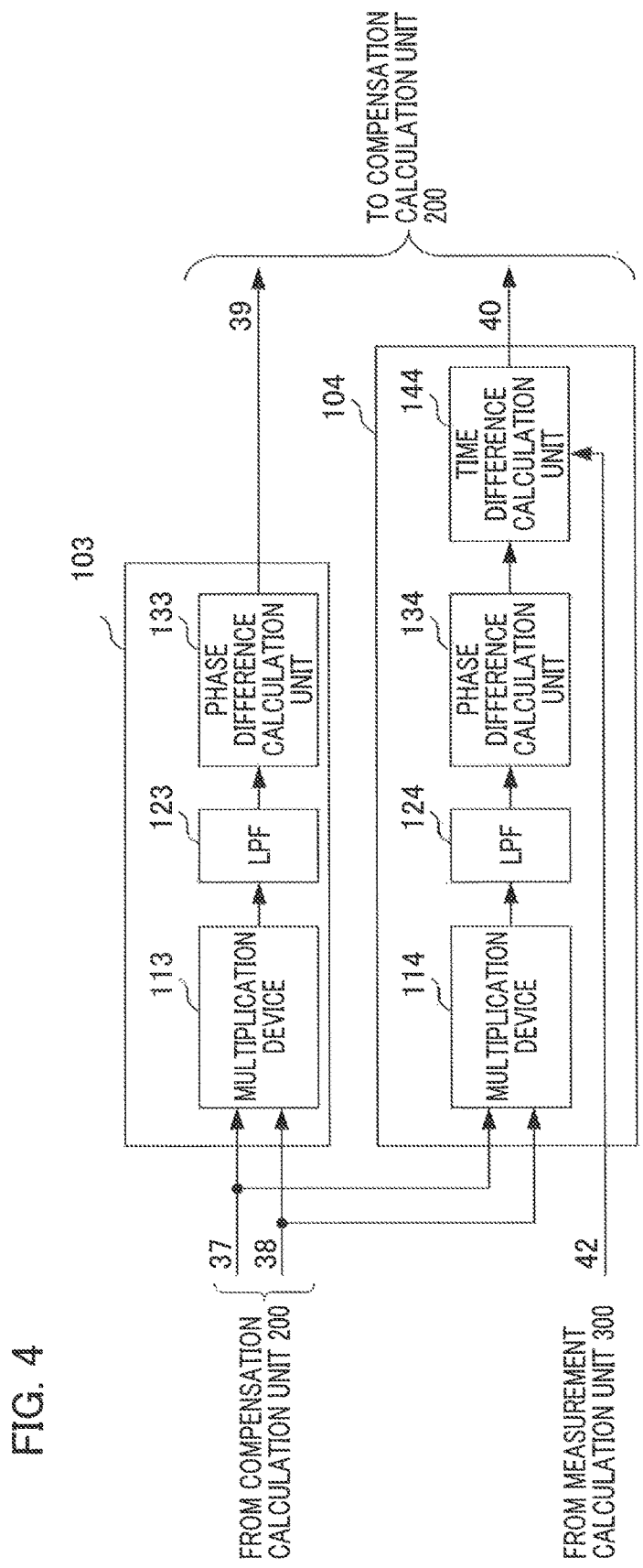
FIG. 4 illustrates a configuration of a time difference compensation signal generating unit and a fixed phase difference compensation signal generating unit.

The compensation signal generation unit 100 generates a compensation signal based on the feedback signal from the compensation calculation unit 200 and the measurement calculation unit 300 described below and the signals from the A/D converters 14 and 24, and sends the signal to the compensation calculation unit 200. The compensation signal generation unit 100 is configured as illustrated in FIG. 3 and includes a gain compensation signal generation unit 101, an offset compensation signal generation unit 102, a fixed phase difference compensation signal generation unit 103, and a time difference compensation signal generation unit 104. Firstly, the gain compensation signal generation unit 101 generates compensation signals configured to compensate for the gain by using the signals from the A/D converters 14 and 24. The offset compensation signal generation unit 102 in the same manner generates signals configured to compensate for the offset by using the signals from the A/D converters 14 and 24. The fixed phase difference compensation signal generation unit 103 includes a multiplication device 113, a low pass filter (LPF) 123, and a phase difference calculation unit 133, and generates a signal configured to compensate for the fixed phase difference by using the signal from the compensation calculation unit 200. The time difference compensation signal generation unit 104 includes a multiplication device 114, a LPF 124, a phase difference calculation unit 134, and a time difference calculation unit 144. The time difference compensation signal generation unit 104 generates a signal configured to compensate for a phase shift resulting from the time difference by using the signal from the compensation calculation unit 200 and the feedback signal from the measurement calculation unit 300. The configuration of the fixed phase difference compensation signal generation unit 103 and the time difference compensation signal generation unit 104 is illustrated in FIG. 4.

Figure 5:
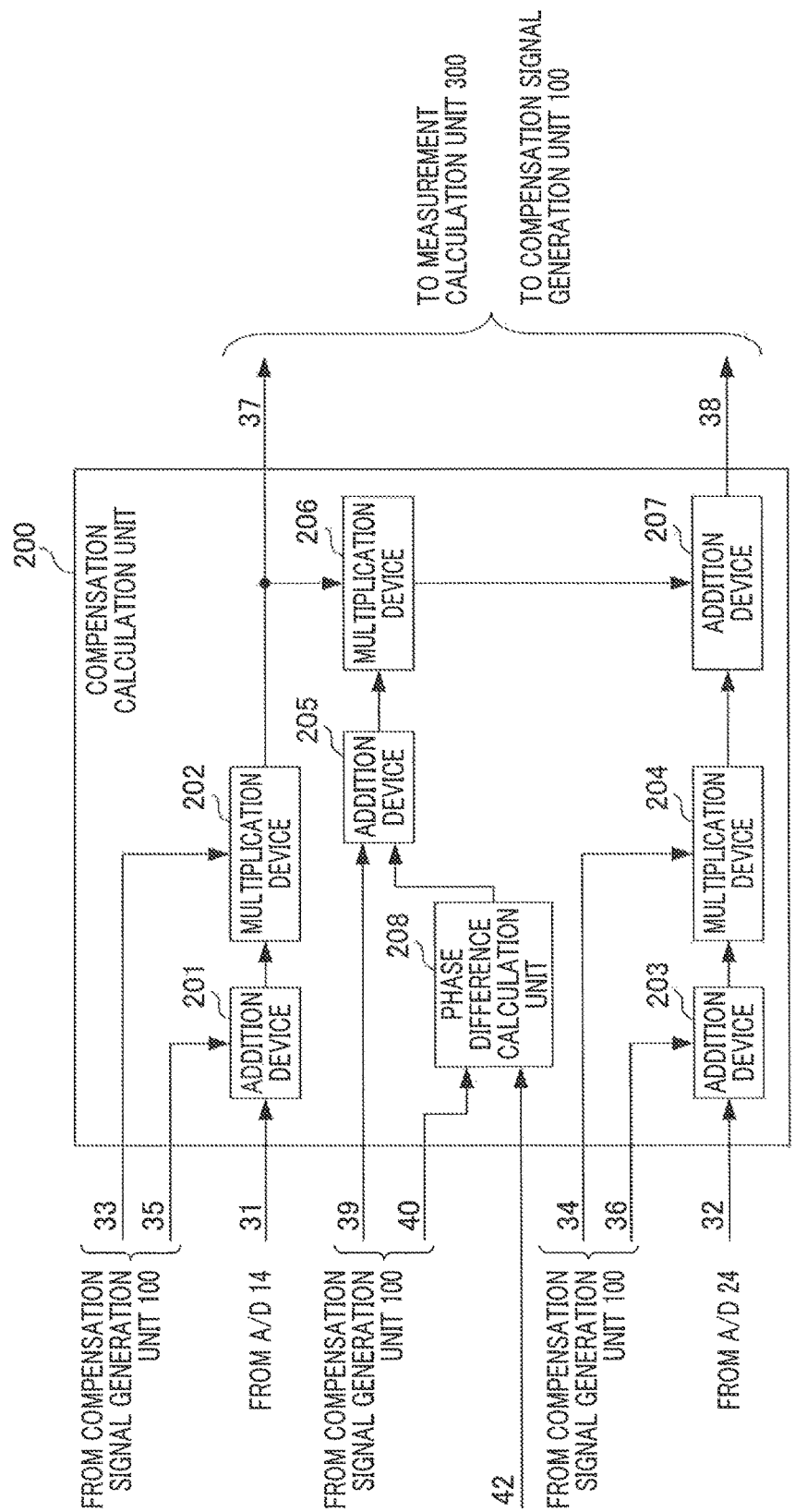
FIG. 5 illustrates a configuration of a compensation calculation unit according to the first exemplary embodiment of the present disclosure.

The compensation calculation unit 200 uses the signal from the A/D converters 14 and 24 and the compensation signal generation unit 100, and the feedback signal from the measurement calculation unit 300 to calculate a compensation value, and sends the calculated signal to the compensation signal generation unit 100 and the measurement calculation unit 300. As illustrated in FIG. 5, the compensation calculation unit 200 includes addition devices 201, 203, 205, and 207, multiplication devices 202, 204, and 206, and a phase difference calculation unit 208. The details of the configuration of the compensation calculation unit 200 will be described below.

Figure 6:
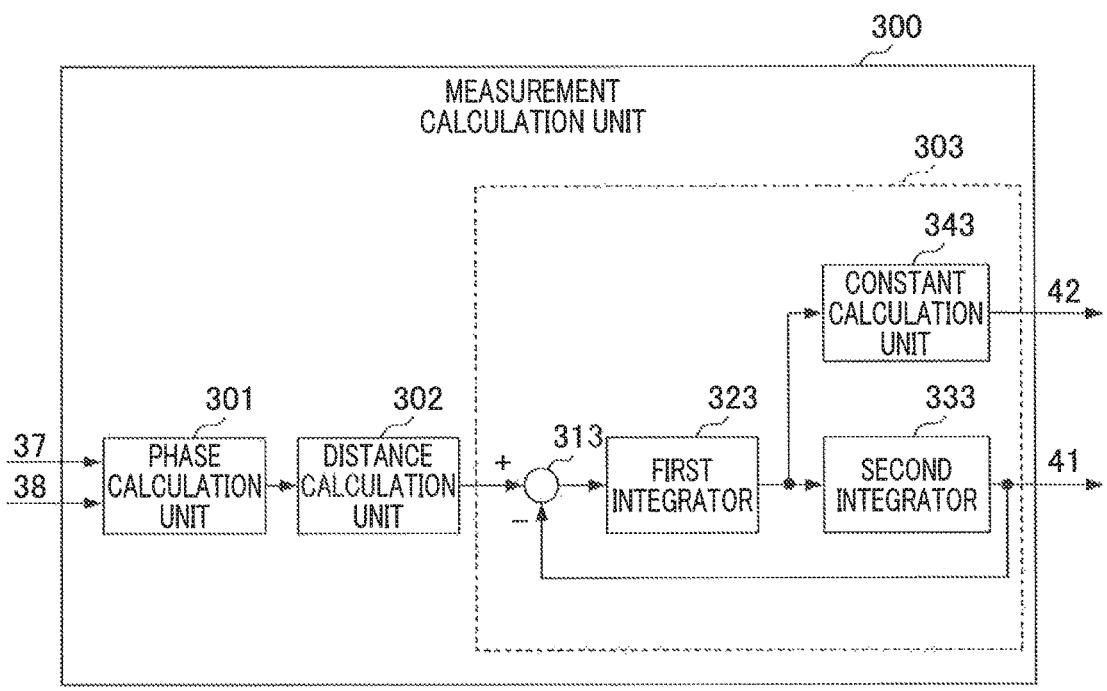
FIG. 6 illustrates a configuration of a measurement calculation unit according to the first exemplary embodiment of the present disclosure.

The measurement calculation unit 300 calculates the phase configuration of the interfering light by using the signal, that has been compensated for offset, gain, fixed phase difference and variable phase difference, from the compensation calculation unit 200, and outputs the position of the object to be measured. Furthermore, a signal is generated based on the frequency f of the detection signal corresponding to the moving velocity. The measurement calculation unit 300 includes a phase calculation unit 301, a distance calculation unit 302 and a closed loop filter 303. The closed loop filter 303 includes an adder/subtracter 313, a first integrator 323, a second integrator 333, and a constant calculation unit 343. The configuration of the measurement calculation unit 300 is illustrated in FIG. 6, and the details will be described below.

Next, reference to the drawings, the operation of the measurement device according to the present exemplary embodiment will be described. Firstly, as illustrated in FIG. 3, the compensation signal generation unit 100 generates various types of compensation signals by using the signals from the A/D converters 14 and 24, the compensation calculation unit 200 and the measurement calculation unit 300. The gain compensation signal generation unit 101 generates a compensation signal to configure the signal gain for the A phase and the B phase as a predetermined value. The offset compensation generation unit 102 generates a compensation signal to configure the signal offset as a value of zero. Here, the A phase and the B phase signals are expressed as illustrated by Equations (1) and (2). Equation (3) expresses the angular velocity equation in which 2 of is the angular frequency corresponding to the frequency f.

$$A(t)=Va \times \cos(\omega t)+Vosa \quad (1)$$

$$B(t)=Vb \times \sin(\omega t+\Delta\theta)+Vosb \quad (2)$$

$$\omega=2\pi f t \quad (3)$$

Va denotes the amplitude of the A phase signal, and Vb denotes the amplitude of the B phase signal. Vosa is the A phase offset and Vosb is the B phase offset. $\Delta\theta$ is the fixed phase difference from the phase difference of 90 degrees between the A phase and the B phase. When the position of the measured unit varies in relation to both the A phase and the B phase, the amplitude of the detection signal undergoes a sine wave change. Here, when the velocity of the object to be measured is denoted as Vel (m/s), the pitch of the lattice pattern is denoted as P(m), and the frequency of the detection signal of the A phase and the B phase is denoted as f(Hz), then:

$$F=Vel/P \quad (4)$$

The frequency f of the detection signal is proportional to the velocity Vel of the object to be measured. For example, when the position change of the measured unit is 1 μm and the pitch of the lattice pattern is P=1 μm, it is assumed that a signal is obtained in which the detection signal for the A phase and the B phase exhibits a period of 1 μm. When the case in which P=1 μm, and Vel=1 m/s is taken as an example, a value of f=1 MHz can be calculated from Equation (4).

Figure 7:
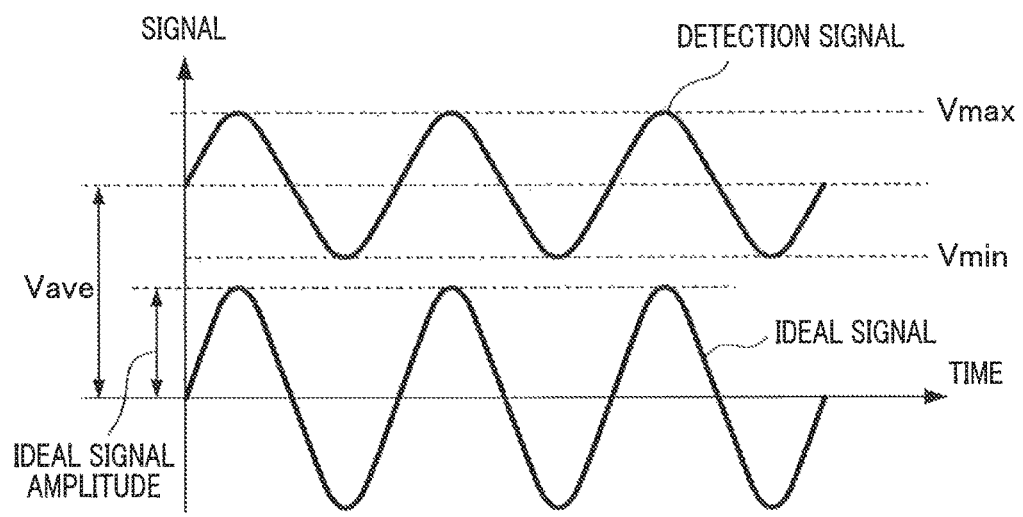
FIG. 7 illustrates an example of an ideal signal and a detection signal before compensation.

FIG. 7 illustrates an example of an ideal signal and a detection signal exhibiting a shift in relation to gain and offset. The gain compensation signal and the offset compensation signal are expressed in the following equations based on FIG. 7.

$$\text{Gain compensation signal=amplitude of ideal signal} \times 2/(V\max-V\min) \quad (5)$$

$$\text{Offset compensation signal}=Vave=(V\max-V\min)/2 \quad (6)$$

A gain compensation signals 33 and 34 and an offset compensation signals 35 and 36 are generated for the A phase and the B phase using Equation (5) and Equation (6). The generated compensation signals 33 to 36 are input to the compensation calculation unit 200.

As illustrated in FIG. 5, the offset relative to the signal 31 from the A/D converter 14 is compensated to zero by the addition device 201 and the offset compensation signal 35, and the gain is compensated to a predetermined value by the gain compensation signal 33 and the multiplication device 202. In this manner, an A phase signal 37 that is compensated in relation to offset and gain can be output. In the same manner, the offset relative to the signal 32 from the A/D converter 24 is compensated to zero by the addition device 203 and the offset compensation signal 36, and the gain is compensated to a predetermined value by the gain compensation signal 34 and the multiplication device 204. In this manner, a B phase signal 38 that is compensated in relation to offset and gain can be output. The addition device 207 will be described below.

Reference to FIG. 4, the fixed phase difference compensation signal generation unit 103 generates a signal so that a fixed phase shift, that is to say, $\Delta\theta$ in Equation (2) exhibits zero. The A phase signal 37 and the B phase signal 38 input from the compensation calculation unit 200 are multiplied in the multiplication device 113, and then DC components are removed by the LPF 123. That is to say, a signal in which the offset is compensated to zero is multiplied by the value V that exhibits a predetermined amplitude in relation to the A phase signal and the B phase signal from Equation (1) and Equation (2), and expressed as:

$$\begin{aligned} A(t) \times B(t) &= V \times \cos(\omega t) \times \{V \times \sin(\omega t + \Delta\theta)\} \\ &= -V^2/2 \times \sin(-\Delta\theta) + V^2/2 \times \sin(2\omega t + \Delta\theta) \end{aligned} \quad (7)$$

The first term on the right side of Equation (7) is the DC signal corresponding to the fixed phase shift $\Delta\theta$, and the second term is the double frequency component corresponding to the frequency f of the detection signal. The DC components Vdc in the first term are removed by the LPF 123.

$$Vdc=-V^2/2 \times \sin(-\Delta\theta) \quad (8)$$

The fixed phase shift $\Delta\theta$ from Equation (8) is used in the phase difference calculation unit 133 to calculate a fixed phase difference calculation signal 39 from:

$$\Delta\theta=\sin^{-1}\{Vdc/(V^2/2)\} \quad (9)$$

When $\Delta\theta$ is a minute angle (<<1 rad), the calculation of sin-1 is not performed, and an approximation may be performed by the calculation of the terms in { } on the right side of Equation (9). Fixed phase difference compensation is performed in the compensation calculation unit 200 by the fixed phase difference compensation signal 39.

Next, fixed phase difference compensation is performed by the addition device 205, the multiplication device 206 and the addition device 207 as illustrated in FIG. 5. The addition device 205 is a calculation device for adding the variable phase difference compensation signal, and is not directly related to the fixed phase difference compensation. After the addition device 205, the fixed phase difference compensation signal 39 is multiplied in the multiplication device 206 by the signal 37 that has been compensated in relation to A phase offset and gain, the amplitude of the A phase signal is adjusted, and added to the B phase signal in the addition device 207 to thereby compensate for the fixed phase shift in the B phase signal. That is to say, when the output of the addition device 205 is denoted as G:

$$\begin{aligned} B(t) + G \times A(t) &= V \times \sin(\omega t + \Delta\theta) + G \times V \times \cos(\omega t) \\ &= \{(V)^2 + (G \times V)^2 + 2 \times G \times V^2 \times \sin(\Delta\theta)\}^{1/2} \times \\ &\quad \sin[\omega t + \tan^{-1}[\{G + \sin(\Delta\theta)\}/\cos(\Delta\theta)]] \end{aligned} \quad (10)$$

G depends on the fixed phase difference compensation signal and reverses the sign in Equation (9), and so the term $\tan^{-1}$ in Equation (10) becomes:

$$\tan^{-1}[\{G+\sin(\Delta\theta)\}/\cos(\Delta\theta)]=0 \quad (11)$$

Since G is sufficient small compared to V, then $$B(t)+G \times A(t) \approx V \times \sin(\omega t) \quad (12)$$

The output of the addition device 207 compensates the fixed phase difference to a value of zero. Therefore, a B phase signal which has been compensated in relation to the fixed phase difference and the offset and gain is outputted.

Figure 8:
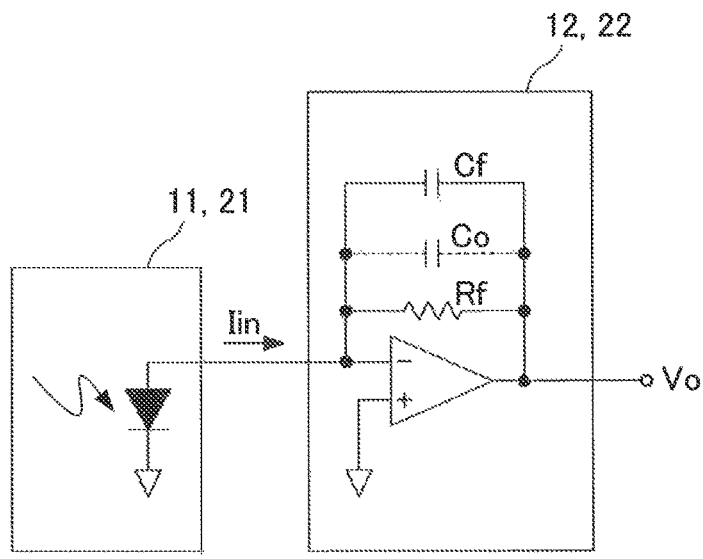
FIG. 8 illustrates a configuration of an I/V convertor according to the first exemplary embodiment of the present disclosure.

Next, the time difference compensation will be described. As described above, when the pitch P of the lattice pattern is P=1 μm, and the position change in the measured unit is 1 μm, the detection signal for the A phase and B phase is assumed to exhibit a period of 1 μm. In this case, when Vel=1 m/s, f=1 MHz. An exemplary configuration of the I/V converters 12 and 22 is illustrated in FIG. 8. Interfering light is converted to a current Iin by the light receiving devices 11 and 21, and converted to a voltage V0 by the I/V converters 12 and 22. Here, the I/V converter 12 and 22 are configured by a resistor Rf, a condenser Cf and an OP amp (calculation amplifier). For example, the time constant is expressed as a first-order delay from the condenser and a resistance of Cf=1.5 pF and Rf=10 kΩ, so that:

$$\text{Time constant}=Rf \times Cf=15.0 \text{ ns} \quad (13)$$

Furthermore, the band fc of the I/V converters 12 and 22 take a value of fc=1/(2×pi×Rf×Cf)=10.6 MHz, and the phase delay relative to the detection signal of 1 MHz is given by:

$$\text{phase delay}=-\tan^{-1}(1/10.6)=-5.4° \quad (14)$$

Figure 9A:
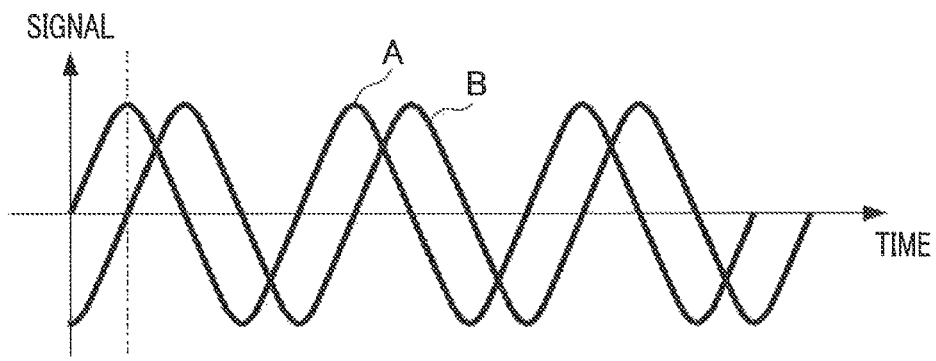
FIG. 9A and FIG. 9B illustrate a signal waveform according to the first exemplary embodiment of the present disclosure.
Figure 9B:
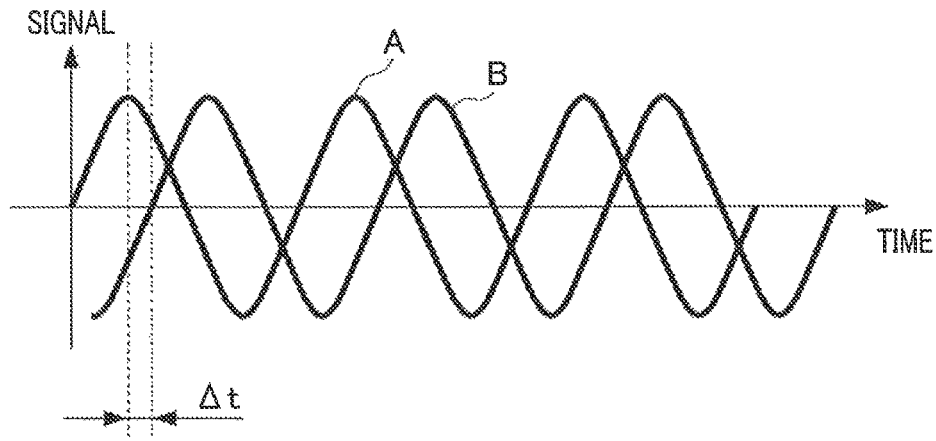

FIG. 9A illustrates the signal waveform after compensation for the fixed phase difference in relation to the waveforms of the A phase and B phase signals, and FIG. 9B illustrates the signal waveform when a delay time Δt is produced in the B phase signal in relation to the signal after compensation for the fixed phase difference. The delay time, for example, is produced as a result of a difference in the A phase and the B phase in the pattern length from the light receiving devices 11 and 21 to the A/D converters 14 and 24, a shift in the sampling timing of the A/D converters 14 and 24, or the like. In relation to the difference in the pattern length is 2 cm, a value of Δt=approximately 0.1 ns is produced, and a value of Δt=approximately 1 ns is produced by a shift in the sampling timing of the A/D converters 14 and 24. The delay time Δt does not depend on the frequency of the detection signal, and basically, is a fixed value, that may vary as a result of environmental conditions such as temperature, humidity, or the like.

In relation to the B phase signal after compensation for gain, offset, and fixed phase difference, when the delay time Δt and the first order delay time constant=Tc of the I/V converters 12 and 22 are given, then:

$$B(t)=V \times \sin \{2\pi f \times (t+\Delta t)+\langle\tan^{-1}(2\pi f \times Tc)\} \quad (15)$$

Here, when 2πf×Tc<<1, that is to say, f<<1/(2pi.Tc) then:

$$\langle\tan^{-1}(2\pi f \times Tc) \approx 2\pi f \times Tc \quad (16)$$

When Equation (16) is substituted into Equation (15), then:

$$B(t)=V \times \sin \{2\pi f \times (t+\Delta t+Tc)\} \quad (17)$$

When the shift in the first order delay time constant of the B phase relative to the A phase is denoted as ΔTc, and substituted into Equation (17), then:

$$B'(t)=V \times \sin \{2\pi f \times (t+\Delta t+\Delta Tc)\} \quad (18)$$

Therefore, the difference (time difference) in the delay time Δτ becomes:

$$\text{Difference in delay time } \Delta\tau=\Delta t+\Delta Tc \quad (19)$$

The phase shift Δφ resulting from Δτ in the frequency f of the detection signal corresponding to the moving velocity is expressed from Equation (18) and Equation (19) as:

$$\Delta\varphi=2\pi f \Delta\tau=2\pi f \times (\Delta t+\Delta Tc) \quad (20)$$

An example of a value for ΔTc will be considered. The floating capacitance Co is parasitic in the circuit periphery of the I/V converters 12 and 22 in FIG. 8, and the capacity of approximately Co=1 pF is parasitic depending on the pattern or the component disposition. When the capacity that depends on the floating capacitance Co and the condenser Cf is written as:

$$Cf+Co=1.5+1=2.5 \text{ pF}$$

Then, the time constant becomes:

$$\text{time constant}=Rf \times Cf=25.0 \text{ ns} \quad (21)$$

and the band fc of the I/V converter becomes:

$$fc=6.4 \text{ MHz}$$

Furthermore, the phase delay relative to the 1 MHz detection signal becomes:

$$\text{phase delay}=-\langle\tan^{-1}(1/6.4)=-8.9° \quad (22)$$

The accuracy of the condenser Cf is approximately ±10%, and there is a possibility of approximately a 10% deviation in the floating capacitance Co. When a capacity with a deviation of Co and Cf is +10% is written as:

$$Cf+Co=2.5 \times 1.1=2.75 \text{ pF}$$

the time constant becomes:

$$\text{time constant}=Rf \times Cf=27.5 \text{ ns} \quad (23)$$

Therefore, the band of the I/V converters 12 and 22 become:

$$fc=5.79 \text{ MHz}$$

and the phase delay becomes:

$$\text{phase delay}=-\tan^{-1}(1/5.8)=-9.80° \quad (24)$$

When a capacity with a deviation of Co and Cf is −10%, is written as:

$$Cf+Co=2.5 \times 0.9=2.25 \text{ pF}$$

the time constant becomes:

$$\text{time constant}=Rf \times Cf=22.5 \text{ ns} \quad (25)$$

Therefore, the band of the I/V converters 12 and 22 becomes:

$$fc=7.07 \text{ MHz}$$

and the phase delay becomes:

$$\text{phase delay}=-\tan^{-1}(1/7.07)=-8.05° \quad (26)$$

The difference in the phase delay and the difference in the time constant resulting from a deviation in Co and Cf from Equation (23) to Equation (26) is:

$$\text{Difference in time constant}=27.5 \text{ ns}-22.5 \text{ ns}=5.0 \text{ ns} \quad (27)$$

$$\text{Difference in phase delay}=-9.8-(-8.05)=-1.75° \quad (28)$$

Figure 10A:
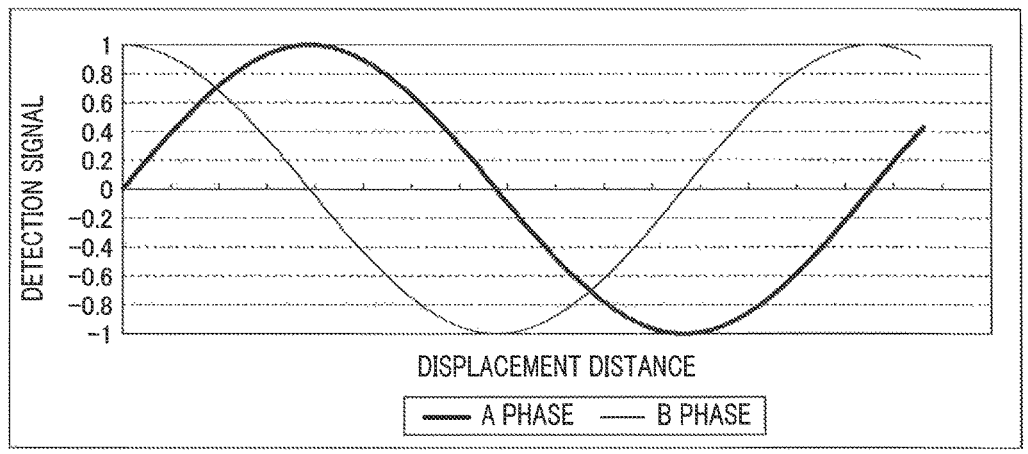
FIG. 10A and FIG. 10B illustrate a detection signal waveform and measurement error characteristics according to the first exemplary embodiment of the present disclosure.
Figure 10B:
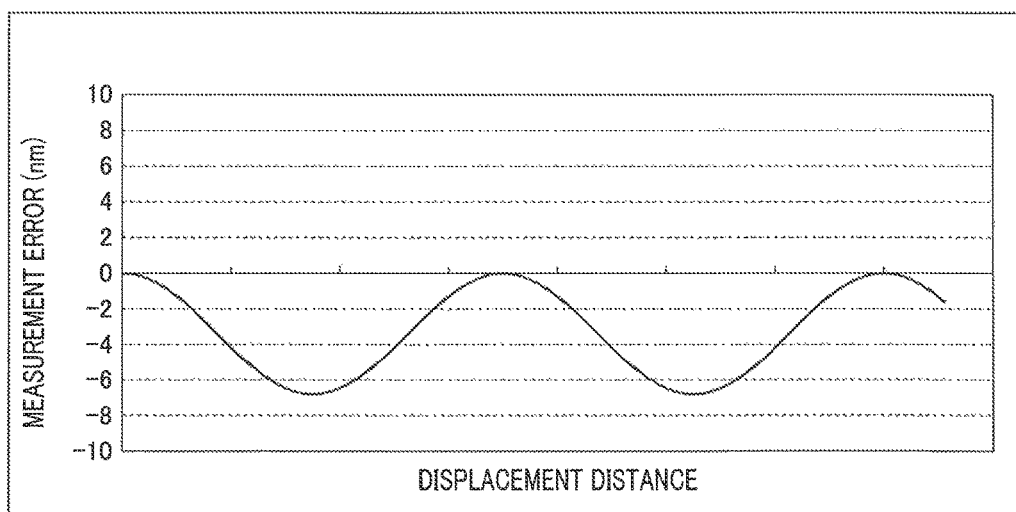

FIG. 10A illustrates the detection signal waveform when the frequency of the A phase and B phase signals is f=1 MHz, that is to say, at Vel=1 m/s, and FIG. 10B illustrates the measurement error for the moving distance when the phase delay difference in Equation (28) is −1.75°. The measurement error for the period of the detection signal exhibits period characteristics in which the error at ½ the period is 0~−6.8 nm. The measurement error resulting from the difference in the phase delay is an extremely large source of error when measuring the moving distance to an accuracy of approximately 1 nm.

Figure 11:
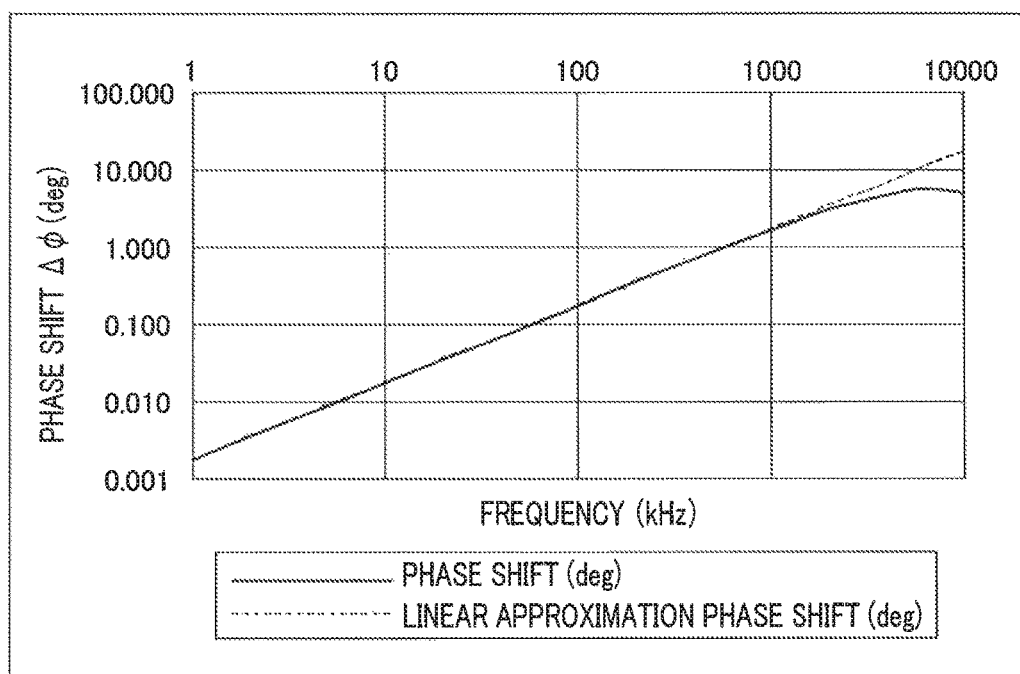
FIG. 11 illustrates the characteristics of a phase shift relative to a frequency.

The phase shift Δφ resulting from Δτ relative to the signal frequency f when Δτ is fixed illustrates characteristics as illustrated in FIG. 11 in Equation (18) and Equation (19). The solid line represents the calculation of the difference when the values in (23) and (25) are substituted into the left side of Equation (16), and the broken line represents the calculation of the difference using linear approximately formula of the right side of Equation (16). Thus, at a frequency which is sufficiently lower than the cutoff frequency fc=1/(2πTc), the phase shift Δφ due to Δτ and the frequency f exhibits a proportional relationship, and as the frequency is reduced, the phase shift also decreases. Furthermore, when the cutoff frequency is approached, a deviation occurs from the linear approximately formula.

Next, the time difference compensation signal generation unit 104 will be described while indicating the differences in the operation of the fixed phase difference compensation signal generation unit 103 and the time difference compensation signal generation unit 104. The unit 103 and the unit 104 constitute a device configured to obtain an error in the phase difference that depends on the frequency and an error in a phase difference, between the electric first phase signal and the electric second phase signal that does not depend on the frequency. A phase shift in the detection signal includes a mixture of a fixed phase shift Δθ expressed by Equation (2) and a phase shift Δφ resulting from the difference Δτ in the delay time expressed by Equations (18) to (20). However, although the characteristics in relation to the frequency f differ, Δθ is a fixed value that does not depend on the frequency f, whereas Δφ exhibits a proportional dependent relationship to the frequency f as described above. Therefore, Δθ is dominant at a low frequency, and the effect of Δφ can be ignored. For example, reference to FIG. 11, at 10 kHz or less, Δφ<0.02°, and in this case, accurate detection of Δθ by the fixed phase difference compensation signal generation unit 103 is possible, and a fixed phase shift Δθ can be compensated for by the compensation calculation unit 200.

Next, as the frequency f increases at a higher moving velocity, Δφ is calculated by the time difference compensation signal generation unit 104 under circumstances in which the effect of Δφ has increased. The multiplication device 114, the LPF 124, and the phase difference calculation unit 134 of the time difference compensation signal generation unit 104 in FIG. 4 execute the same operation as the fixed phase difference compensation signal generation unit 103. A fixed phase shift Δθ is compensated by the compensation calculation unit 200. That is, the error in the phase difference that does not depend on the frequency is obtained before the error in the phase difference that does depend on the frequency. The calculation in the phase difference calculation unit 134 is performed using Equation (7), Equation (18), and Equation (19), so that:

$$A(t) \times B'(t) \quad (29)$$
$$= V \times \cos(\omega t) \times [V \times \sin\{\omega \times (t + \Delta_T)\}]$$
$$= -V^2/2 \times \sin(-\omega \Delta_T) + V^2/2 \times \sin(2\omega t + \omega \Delta_T)$$

The first term on the right side of Equation (29) is a DC signal correlated with the difference Δτ of the delay time, and the second term is the double frequency component corresponding to the frequency f of the detection signal. The DC component Vdc in the first term is removed by the LPF 124.

$$Vdc=-V^2/2 \times \sin(-\omega \Delta \tau) \quad (30)$$

$$\sin(\omega \Delta \tau) = Vdc/(V^2/2) \quad (31)$$

As described above, the amount of the fluctuation in the phase difference that depends on the frequency is obtained based on a DC component of a signal obtained by multiplying the electric first phase signal by the electric second phase signal. Additionally, the error in the phase difference that depends on the frequency is obtained based on the electric first phase signal and the electric second phase signal for which the error in the phase difference that does not depend on the frequency has been compensated.

The phase shift Δφ is calculated in the phase difference calculation unit 134 using Equation (32) or Equation (33).

$$\Delta \varphi = \omega \Delta \tau = \sin^{-1}\{Vdc/(V^2/2)\} \quad (32)$$

$$\text{When } \Delta \varphi \ll 1 (\text{rad}), \Delta \varphi \approx Vdc/(V^2/2) \quad (33)$$

Next, the time difference calculation unit 144 calculates the difference Δτ for the delay time per unit angular frequency using the signal 42 based on the frequency f for the detection signal corresponding to the moving velocity after measuring Vdc, and outputs the calculation result as a time difference compensation signal 40.

$$\Delta \tau = \Delta \varphi/(2 \times \pi \times f) \quad (34)$$

As described above, the difference Δτ in the delay time does not depend on the frequency of the detection signal, and basically is a fixed value, that may vary as a result of environmental conditions such as temperature, humidity, or the like. Therefore, there is no requirement for constant measurement and calculation of Δτ, and re-measurement may be performed when there is a possibility of variation in Δτ resulting from temporal change or environmental change such as temperature, humidity, or the like.

From the above description, when the object to be measured is configured in the scanning direction of the reticle stage 4 and the wafer stage 7, the scan driving velocity during exposure, that is to say, the moving velocity is stable and maximized. Furthermore, when the wafer stage 7 is configured in the step direction, a maximum step driving velocity when displacing to the next chip after exposure is enabled. Therefore, when the scan driving velocity and the step driving velocity take the maximum velocity, the frequency f takes the maximum value and is an optimal condition to measure the difference Δτ of the delay time. Furthermore, during scan driving or step driving, if the reticle stage 4 or the wafer stage 7 displace at a constant velocity, measurement of the difference Δτ of the delay time can be performed. In this case, the measurement of the difference Δτ of the delay time may be performed in relation to each of scan driving or step driving, or may be periodically performed by use of a time interval for measurement of an arbitrary length. Furthermore, in addition to the exposure operation, a configuration is possible in which a measurement sequence is provided, and driving is performed to approximately the maximum velocity in each step at which the frequency increases to thereby calculate the difference in the delay time, and calculate the fixed phase shift at low velocity driving in which the frequency is sufficiently lowered. Furthermore, a configuration is possible in which the difference Δτ of the delay time is measured by application to the light receiving devices 11 and 21 or the I/V converters 12 and 22 of an electrical high frequency signal that is equal to the frequency detected at high velocity, without actually driving the object to be measured.

In this manner, the measurement device according to the present embodiment may calculate a difference in a delay time in a device configured to output a first and a second phase signal. Therefore, it is sufficient to measure the difference $\Delta\tau$ in the delay time resulting from the floating capacitance in the circuit or the I/V converters 12 and 22, and the shift in the sampling timing or the difference between the A phase and the B phase in the pattern length from the light receiving devices 11 and 21 to the A/D converters 14 and 24. Furthermore, there is no particular limitation in relation to the method of measurement. A configuration is possible in which the difference $\Delta\tau$ in the delay time calculated by the time difference calculation unit 144 may be stored in a storage device (not illustrated).

The phase difference calculation unit 208 of the compensation calculation unit 200 illustrated in FIG. 5 calculates the phase shift $\Delta\varphi$ corresponding to the moving velocity by use of the signal 42 based on the frequency f of the detection signal corresponding to the moving velocity and the time difference compensation signal 40 that expresses the difference $\Delta\tau$ of the delay time.

$$\Delta\varphi = 2 \times \pi \times f \times \Delta\tau \tag{35}$$

$\Delta\tau$ is a fixed value calculated as a result of the above measurement. However, since the frequency f changes in response to the moving velocity, the value of the phase shift $\Delta\varphi$ is a variable phase difference compensation signal that changes in response to the moving velocity. This phase shift $\Delta\varphi$, that is to say, the variable phase difference compensation signal is added to the fixed phase difference compensation signal 39 by the addition device 205. Thereafter, in the same manner as the fixed phase difference compensation described above, the offset and gain in the A phase is multiplied by the compensated signal 37 in the multiplication device 206, and the amplitude of the A phase signal is adjusted and is added to the B phase signal in the addition device 207. In this manner, compensation of both the fixed phase shift $\Delta\varphi$ of the B phase signal and the phase shift $\Delta\varphi$ resulting from the difference $\Delta\tau$ in the delay time is enabled.

When a frequency is input that is approximately greater than or equal to the cutoff frequency $fc=1/(2\pi Tc)$ as illustrated in FIG. 11, the compensation error increases in relation to the variable phase difference compensation signal for the phase shift $\Delta\varphi$ resulting from Equation (35). In this case, the difference $\Delta\tau$ of the delay time in Equation (34) is calculated at a moving velocity at which the frequency is approximately greater than or equal to the cutoff frequency, to thereby calculate the phase shift $\Delta\varphi$ using broken line approximation or curved line approximation in relation to the frequency f of the detection signal corresponding to a required accuracy.

As illustrated in FIG. 6, the A phase signal 37 and the B phase signal 38 from the compensation calculation unit 200 are calculated in relation to the phase of the interfering light by the phase calculation unit 301. The phase may be calculated by calculating $\tan^{-1}$ of the ratio of the A phase signal and the B phase signal, or the phase may be calculated by looking up a table corresponding to the signal ratio. The calculated phase signal is used by the distance calculation unit 302 to calculate the moving distance of the object to be measured. For example, when the pitch of the lattice pattern is 1 µm, a moving distance of 1 µm results from a 2 n change in the phase signal. Even when measuring a rotation angle, in the same manner, the rotation angle is allocated to the pitch of the lattice pattern, and when for example 360° is allocated to 1000 equal units, a rotation angle of 0.36° results from a 2 n change in the phase signal.

The value for the distance calculated by the distance calculation unit 302 in relation to the A phase signal 37 and the B phase signal 38 includes noise as a result of the superimposition of noise such as shot noise from the light receiving devices 11 and 21 or the I/V converters 12 and 22, thermal noise, or noise from the OP amp, or the like. The following closed loop filter 303 is provided in order to reduce such noise. The closed loop filter 303 includes an adder/subtracter 313, and a first integrator 323 and second integrator 333 that are connected in series. An output 41 of the second integrator 333 is output as a position of the object to be measured, and is provided as feedback to the adder/subtracter 313. The closed loop filter 303 can reduce noise and uses a feedback configuration to suppress the deviation in relation to the input signal to zero, and therefore enables output of a more accurate moving distance. Furthermore, since the output of the second integrator 333 expresses distance, the first stage, that is to say, the output of the first integrator 323 is a signal that corresponds to the velocity. A signal 42 based on the frequency f of the detection signal for the A phase and the B phase is calculated in the constant calculation unit 343 based on the pitch of the lattice pattern in Equation (4) from a signal that corresponds to the velocity. The signal 42 is an accurate output in which noise is reduced by the closed loop filter 303.

In this manner, the use of an encoder according to the present embodiment in relation to the reticle stage 4 and the wafer stage 7 enables compensation of a phase shift resulting from a time difference in an output signal from the stage that is driven at an extremely high velocity. As a result, it is possible to compensate for the measurement error and perform control and highly accurate stage positional measurement. That is to say, the encoder measures the position of the object to be measured and enables compensation for a fluctuation in the phase difference that is dependent on a frequency based on at least one of the output signals, and enables compensation for the measurement error resulting from the time difference.

According to the present embodiment, a measurement device can be provided that is configured to compensate for a measurement error that results from a time difference between the phases of output signals. (Method of Manufacturing Product)

The method of manufacturing a device according to the present exemplary embodiment for example is suitable for manufacture of a device such as an element or the like that has microstructure or a micro-device such as a semiconductor device. The method of manufacture may include a step of forming a pattern (for example, a latent image pattern) using the lithography device on an article (a substrate that includes a photosensitive material on a surface for example), and a step of processing the article forming the pattern in the previous step (for example a development step). Furthermore, the manufacture method may include other known steps (oxidation, film deposition, vapor deposition, doping, flattening, etching, resist peeling, dicing, bonding, and packaging, or the like). The device manufacturing method of this embodiment has an advantage, as compared with a conventional device manufacturing method, in at least one of performance, quality, productivity and production cost of a device.

The exemplary embodiments of the present disclosure have been described above. However, the present disclosure is not limited to the exemplary embodiments, and may be subject to various modifications or changes within the scope of the spirit of the disclosure. For example, in the exemplary embodiment above, an example of a lithography device has been described in which the exposure device 1 uses ultraviolet light, vacuum ultraviolet light, or extreme ultraviolet light. However, the lithography device is not limited in this regard, and may be configured as a lithography device that includes a moveable stage to hold the substrate or the original plate. For example, a rendering device may be configured that performs rendering on a substrate (photosensitive material) using a charged particle beam such as an electron beam, or an imprint device may be configured to form a pattern on the substrate by forming an imprint material (mold) on the substrate by use of a die.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-172517 filed Aug. 3, 2012 which is hereby incorporated by reference herein in its entirety.

What is claimed is:

1. A measurement apparatus which measures a position of an object based on a first phase signal and a second phase signal whose phases are different from each other, the apparatus comprising:
a light receiving device configured to convert the first phase signal and the second phase signal to an electric first phase signal and an electric second phase signal; and
a compensator configured to compensate for a fluctuation in a phase difference between the electric first phase signal and the electric second phase signal due to a frequency characteristic of the light receiving device based on a frequency of the electric first phase signal and the electric second phase signal and on predetermined information for obtaining an amount of the fluctuation from the frequency.

2. The measurement apparatus according to claim 1, wherein the compensator is configured to compensate for the fluctuation by obtaining the amount of the fluctuation based on a difference in a delay time per unit angular frequency between the electric first phase signal and the electric second phase signal and an angular frequency corresponding to the frequency.

3. The measurement apparatus according to claim 1, wherein the compensator is configured to adjust an amplitude of the electric first phase signal based on the amount of the fluctuation, and adds the electric first phase signal, whose amplitude has been adjusted, to the electric second phase signal, so as to compensate for the fluctuation.

4. The measurement apparatus according to claim 1, further comprising:
a device configured to obtain an error in the phase difference that depends on the frequency and an error in a phase difference, between the electric first phase signal and the electric second phase signal, that does not depend on the frequency,
wherein the error in the phase difference that does not depend on the frequency is obtained before the error in the phase difference that depends on the frequency, and
wherein the error in the phase difference that depends on the frequency is obtained based on the electric first phase signal and the electric second phase signal for which the error in the phase difference that does not depend on the frequency has been compensated.

5. The measurement apparatus according to claim 4, wherein the frequency for which the error in the phase difference that depends on the frequency is obtained is higher than the frequency for which the error in the phase difference that does not depend on the frequency is obtained.

6. The measurement apparatus according to claim 1, further comprising:
a scale on which elements for generating the first phase signal and the second phase signal are disposed at an interval,
wherein the frequency is obtained based on a moving velocity of the object and the interval.

7. The measurement apparatus according to claim 1, further comprising:
an output device configured to output a position of the object based on the electric first phase signal and the electric second phase signal, between which the fluctuation is compensated for,
wherein the output device includes a closed loop filter including a first integrator and a second integrator in series, and is configured to output the position of the object via the closed loop filter.

8. The measurement apparatus according to claim 7, further comprising:
a device configured to obtain the frequency based on an output of the first integrator.

9. The measurement apparatus according to claim 4, wherein the amount of the fluctuation in the phase difference that depends on the frequency is obtained based on the electric first phase signal and the electric second phase signal obtained in a case where the object is moving at a constant velocity.

10. The measurement apparatus according to claim 9, wherein the amount of the fluctuation in the phase difference that depends on the frequency is obtained based on a DC component of a signal obtained by multiplying the electric first phase signal by the electric second phase signal.

11. A lithography apparatus which forms a pattern on a substrate, the apparatus comprising:
a holder configured to hold an original or the substrate and to be moved; and
a measurement apparatus configured to measure a position of the holder,
wherein the measurement apparatus is configured to measure the position of the holder based on a first phase signal and a second phase signal whose phases are different from each other, the measurement apparatus including:
a light receiving device configured to convert the first phase signal and the second phase signal to an electric first phase signal and an electric second phase signal; and
a compensator configured to compensate for a fluctuation in a phase difference between the electric first phase signal and the electric second phase signal due to a frequency characteristic of the light receiving device based on a frequency of the electric first phase signal and the electric second phase signal and on predetermined information for obtaining an amount of the fluctuation from the frequency.

12. A method of manufacturing an article, the method comprising steps of:
forming a pattern on a substrate using a lithography apparatus; and
processing the substrate, on which the pattern has been formed, to manufacture the article,
wherein the lithography apparatus comprising:
a holder configured to hold an original or the substrate and to be moved; and a measurement apparatus configured to measure a position of the holder,
wherein the measurement apparatus is configured to measures the position of the holder based on a first phase signal and a second phase signal whose phases are different from each other, the measurement apparatus including:
a light receiving device configured to convert the first phase signal and the second phase signal to an electric first phase signal and an electric second phase signal; and
a compensator configured to compensate for a fluctuation in a phase difference between the electric first phase signal and the electric second phase signal due to a frequency characteristic of the light receiving device based on a frequency of the electric first phase signal and the electric second phase signal and on predetermined information for obtaining an amount of the fluctuation from the frequency.

13. The measurement apparatus according to claim 1, wherein each of the first phase signal and the second phase signal is a light signal.

* * * * *